United States Patent
Rhe et al.

(10) Patent No.: US 10,475,874 B2
(45) Date of Patent: Nov. 12, 2019

(54) FLEXIBLE ELECTROLUMINESCENT DISPLAY DEVICE

(71) Applicant: LG Display Co., Ltd., Seoul (KR)

(72) Inventors: Ruda Rhe, Seongnam-si (KR); Deuksu Lee, Goyang-si (KR); Jeonghoon Lee, Paju-si (KR); Jihyun Jung, Paju-si (KR); Jaegyun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 79 days.

(21) Appl. No.: 15/807,955

(22) Filed: Nov. 9, 2017

(65) Prior Publication Data

US 2018/0151662 A1  May 31, 2018

(30) Foreign Application Priority Data

Nov. 25, 2016 (KR) .................. 10-2016-0158462

(51) Int. Cl.
*H01L 27/32* (2006.01)
*H01L 51/00* (2006.01)
(Continued)

(52) U.S. Cl.
CPC .......... *H01L 27/3276* (2013.01); *G06F 3/044* (2013.01); *G06F 3/0412* (2013.01); (Continued)

(58) Field of Classification Search
CPC . G06F 2203/04102; G06F 2203/04111; G06F 2203/04112; G06F 3/0412;
(Continued)

(56) References Cited

U.S. PATENT DOCUMENTS

2014/0232956 A1*  8/2014  Kwon .............. G02F 1/133305
                                                        349/12
2015/0179728 A1*  6/2015  Kwon ................. H01L 27/3276
                                                        257/40
(Continued)

FOREIGN PATENT DOCUMENTS

EP    3 001 479 A1   3/2016
EP    3 217 265 A1   9/2017

OTHER PUBLICATIONS

Extended European Search Report dated, dated Apr. 5, 2018 in corresponding European Patent Application No. 17192303.0.

*Primary Examiner* — Hong Zhou
(74) *Attorney, Agent, or Firm* — Morgan, Lewis & Bockius LLP

(57) ABSTRACT

An electroluminescent display device includes: a substrate including: an active area, and bezel area outside the active area and including a bending area, a first organic insulation layer (OIL) in the active area, covering a first signal line extending from the active area to the bezel area, a second OIL in the bending area, the second OIL being in a same layer as the first organic insulation film, first and second touch electrodes crossing over each other and sealing the active area on an encapsulation layer above the first OIL with a third OIL therebetween, a first signal line link pattern connected to the first signal line, and on the second OIL in the bending area, and second and third signal lines respectively connected to the first and second touch electrodes, and on the second OIL in parallel with the first signal line link pattern.

21 Claims, 17 Drawing Sheets

(51) Int. Cl.
*G06F 3/041* (2006.01)
*G06F 3/044* (2006.01)
*G09G 3/3291* (2016.01)

(52) U.S. Cl.
CPC ........ *H01L 27/323* (2013.01); *H01L 51/0097* (2013.01); *G06F 2203/04102* (2013.01); *G06F 2203/04111* (2013.01); *G06F 2203/04112* (2013.01); *G09G 3/3291* (2013.01); *G09G 2310/08* (2013.01); *G09G 2354/00* (2013.01); *H01L 27/3258* (2013.01); *H01L 2251/5338* (2013.01)

(58) Field of Classification Search
CPC ................ G06F 3/044; G09G 2310/08; G09G 2354/00; G09G 3/3291; H01L 2251/5338; H01L 27/323; H01L 27/3258; H01L 27/3276; H01L 51/0097
See application file for complete search history.

(56) References Cited

U.S. PATENT DOCUMENTS

| | | |
|---|---|---|
| 2015/0227170 A1* | 8/2015 | Kim ................ G06F 1/1643 345/174 |
| 2015/0380679 A1 | 12/2015 | Fujiyoshi et al. |
| 2016/0093827 A1 | 3/2016 | Han |
| 2016/0218305 A1* | 7/2016 | Kim ................ G02F 1/133305 |
| 2016/0315284 A1 | 10/2016 | Jeon |
| 2017/0237025 A1 | 8/2017 | Choi et al. |
| 2017/0262109 A1 | 9/2017 | Choi et al. |
| 2017/0278901 A1* | 9/2017 | Kim ................ H01L 51/0097 |
| 2017/0288007 A1* | 10/2017 | Shin ................ H01L 51/56 |

* cited by examiner

FLEXIBLE ELECTROLUMINESCENT DISPLAY DEVICE

CROSS-REFERENCE TO RELATED APPLICATIONS

This application claims the priority of Korean Application No. 10-2016-0158462, filed on Nov. 25, 2016, the entirety of which is hereby incorporated by reference.

BACKGROUND

1. Technical Field

The present disclosure relates to a flexible electroluminescent display device, and more particularly, to a flexible electroluminescent display including a touch sensor.

2. Discussion of the Related Art

Recently, various flat panel display devices having reduced weight and volume, which are disadvantages of a cathode ray tube (CRT), are being developed. Examples of such a flat panel display device include a liquid crystal display (LCD), a field emission display (FED), a plasma display panel (PDP), an electroluminescent display device, and so on.

Because the flat panel display device is thin and lightweight, it is widely used as a display means in a mobile communication terminal or a portable information processing devices. In particular, there is a growing demand for display panels that are thinner, lighter, and have lower power consumption in portable or mobile devices. Such display devices are being applied, not only to mobile devices, such as smart phones and tablet PCs, but also to various fields such as TVs (televisions), automobile displays, wearable devices, and so on. Such display devices are required to be structurally modified in various to be applied to various fields.

According to this demand, in recent years, development of a flexible electroluminescent display device capable of bending or folding has been actively progressing. For example, a flexible electroluminescent display device, which is manufactured so that display performance can be maintained, even when it bends like paper, by using a flexible material, such as flexible plastic or metal foil as a substrate, is rapidly emerging as a next-generation flat panel display device.

In general, such display devices require an interface to an input device that is convenient, simple, and can reduce malfunctions. According to such demands, a touch sensor has been proposed in which a user directly touches a screen with a hand or a pen to input information. Such a touch sensor is used in combination with a display device in various ways.

A flexible electroluminescence display device (hereinafter, simply referred to as a "flexible electroluminescence display device") having a related art touch sensor will be described with reference to FIGS. 1 and 2.

FIG. 1 is a plan view showing a related art flexible electroluminescence display device. FIG. 2 is a cross-sectional view taken along line I-I' of FIG. 1.

With reference to FIGS. 1 and 2, a related art flexible electroluminescent display device includes an active area AA and a bezel area ZA. The bezel area ZA includes a link area LA, a bending area BA, and a pad area PA as areas outside the active area AA.

The active area AA is an area in which an input image is displayed and information is input through a touch or proximity of an object such as a finger or a stylus pen. Display elements, such as gate lines, data lines, thin film transistors, storage capacitors, organic light-emitting diodes, and so on, for displaying an input image are disposed in the area AA. Touch sensors for sensing touch inputs are also disposed in the area AA.

The active area AA, in which the display elements are disposed, includes a gate insulation layer GI covering the gate lines and gate electrodes of thin film transistors, a passivation film PAS covering source and drain electrodes of the thin film transistors and data lines formed on the gate insulation layer GI, a planarization layer PL formed on the passivation film PAS, and a bank BN formed to expose organic light-emitting diodes (not shown) disposed on the planarization layer PL. An encapsulation layer ENC is disposed on the bank BN to prevent moisture from permeating from the outside.

A touch sensor is formed on the encapsulation layer ENC. The touch sensor includes a plurality of first touch electrodes Tx, arranged in parallel along a first direction, and a plurality of second touch electrodes Rx, arranged in parallel along a second direction crossing the first direction.

The data lines (not shown) extending from the active area AA, a plurality of first routing wires TW connected to the plurality of first touch electrodes Tx, and a plurality of second routing wires RW connected to the plurality of second touch electrodes Rx are disposed in the link area LA and the bending area BA.

The link area LA is an area located between the active area AA and the bending area BA. In the link area LA the data lines DL, extending from the active area AA to the bending area BA, and the plurality of first and second routing wires TW and RW are arranged side by side. The plurality of first and second routing wires TW and RW are disposed on the gate insulation layer GI on the substrate SUB.

In the bending area BA, the data lines extending from the link area LA to the pad area PA, and the plurality of first and second routing wires TW and RW are arranged side by side. The plurality of first and second routing wires TW and RW are disposed on the gate insulation layer GI and the first insulation layer INS1 on the substrate SUB. The first insulation layer INS1 is formed of an organic insulation material.

In the pad area PA, pads are disposed for receiving signals supplied from the outside or for supplying signals transmitted from the active area AA. The pads include data pads (not shown) connected to the data lines DL and the first and second touch pads TP and RP respectively connected to the first and second routing wires TW and RW. The data pads (not shown) and the first and second touch pads TP and RP are disposed on the gate insulation layer GI formed on the substrate SUB.

In the above-described related art flexible electroluminescent display device, the substrate SUB may be formed of a flexible plastic material. The bending area BA is a flexible area and has flexibility. Because the bending area BA can be bent toward the front or rear direction of the display device, stress acts on the bending area BA. If cracks or disconnections are generated in the data lines or the routing wires (hereinafter, referred to as "signal wires") due to such stress, the signals are not supplied, thereby causing an abnormality in the display function or the touch function.

Therefore, in the related art flexible electroluminescence display device, to prevent the signal wires from being damaged due to the stress applied at the time of bending, the gate insulation layer GI, which generates a lot of stress, is replaced with the first insulation layer INS made of an organic insulation material under the signal wires of the bending area BA, and the planarization layer PL is disposed to cover the signal wires.

However, according to such a structure, because one mask process has to be added to the first insulation layer INS 1 for reducing the stress under the signal wires in the bending area BA, the process time and manufacturing cost are increased.

SUMMARY

Accordingly, the present disclosure is directed to a flexible electroluminescent display device that substantially obviates one or more of the issues due to limitations and disadvantages of the related art.

An aspect of the present disclosure is to provide an electroluminescent display device capable of reducing stress applied to signal wires in a bending area to protect the signal wires and reducing one mask process.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an electroluminescent display device, including: a substrate including: an active area, and bezel area outside the active area and including a bending area, a first organic insulation layer in the active area, the first organic insulation layer covering a first signal line extending from the active area to the bezel area, a second organic insulation layer in the bending area, the second organic insulation layer being in a same layer as the first organic insulation film, first and second touch electrodes crossing over each other and sealing the active area on an encapsulation layer above the first organic insulation layer with a third organic insulation layer therebetween, a first signal line link pattern connected to the first signal line, the first signal line link pattern being on the second organic insulation layer in the bending area, and second and third signal lines respectively connected to the first and second touch electrodes, the second and third signal lines being on the second organic insulation layer in parallel with the first signal line link pattern.

In another aspect, there is provided an electroluminescent display device, including: a substrate including: an active area, and a bezel area outside the active area and including a bending area, a first organic insulation layer in the active area, the first organic insulation layer covering a first signal line extending from the active area to the bezel area, a second organic insulation layer in the bending area, the second organic insulation layer being in a same layer as the first organic insulation film, first and second touch electrodes crossing over each other and sealing the active area on an encapsulation layer above the first organic insulation layer with a third organic insulation layer therebetween, a first signal line link pattern connected to the first signal line on a third organic insulation layer covering the second organic insulation layer in the bending area, and second and third signal lines respectively connected to the first and second touch electrodes, the second and third signal lines being on the third organic insulation layer in parallel with the first signal line link pattern.

In another aspect, there is provided an electroluminescent display device, including: a substrate including: an active area, and a bezel area outside the active area and including a bending area, a first organic insulation layer in the active area, the first organic insulation layer covering a first signal line extending from the active area to the bezel area, a second organic insulation layer in the bending area, the second organic insulation layer being in a same layer as the first organic insulation film, first and second touch electrodes crossing over each other and sealing the active area on an encapsulation layer above the first organic insulation layer with a third organic insulation layer therebetween, a first signal line link pattern connected to the first signal line, the first signal line link pattern being on the second organic insulation layer in the bending area, second and third signal lines respectively connected to the first and second touch electrodes, the second and third signal lines being on the second organic insulation layer in parallel with the first signal line link pattern, a first signal line auxiliary link pattern on a third insulation layer covering the first signal link pattern and the second and third signal lines, the first signal line auxiliary link pattern being connected to the first signal line link pattern, a second signal line auxiliary pattern connected to the second signal line, a third signal line auxiliary pattern connected to the third signal line, and a fourth organic insulation layer covering the first signal line auxiliary link pattern, and covering the second and third signal line auxiliary patterns.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
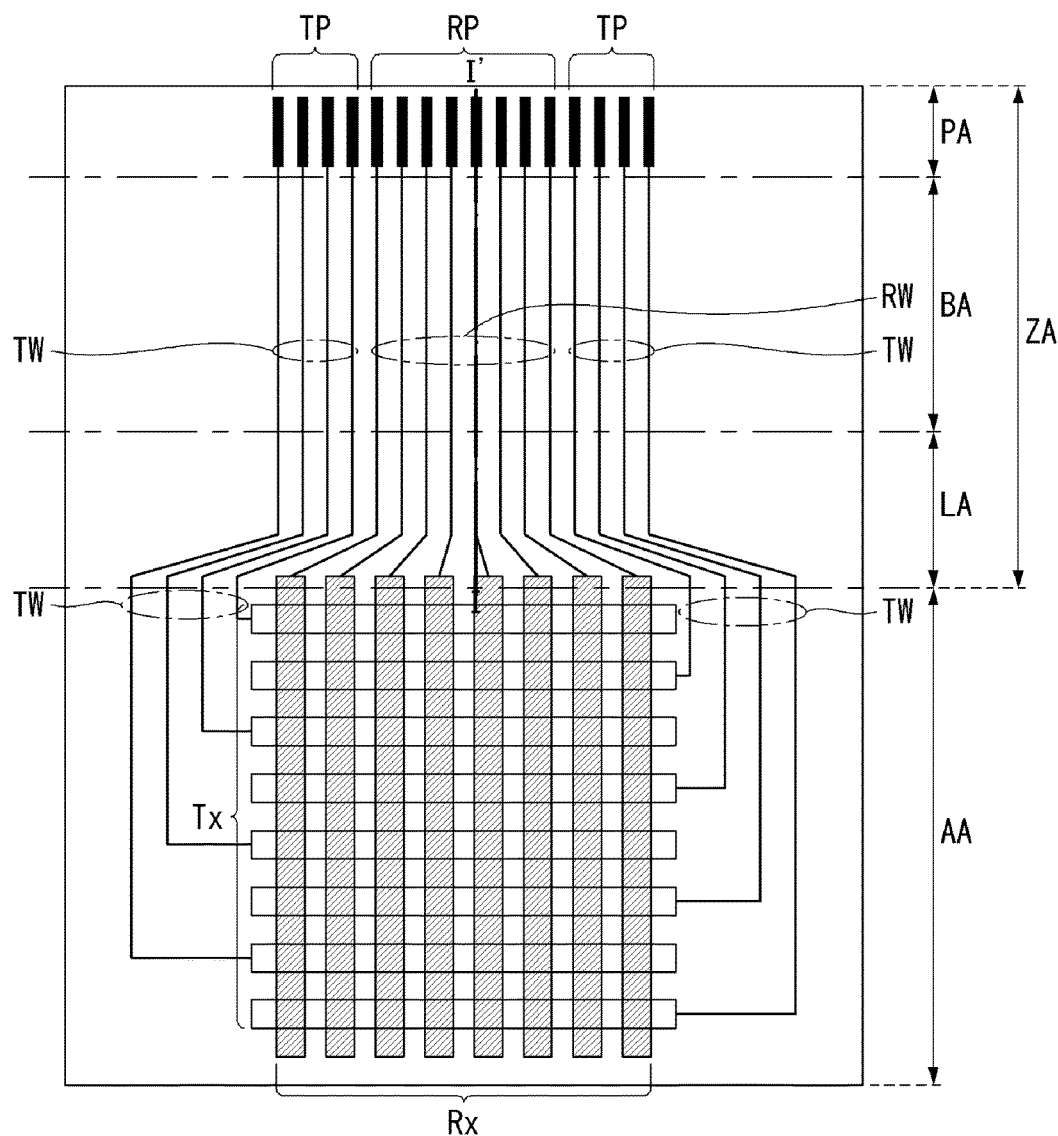
FIG. 1 is a plan view showing a related art flexible electroluminescence display device.
Figure 2:
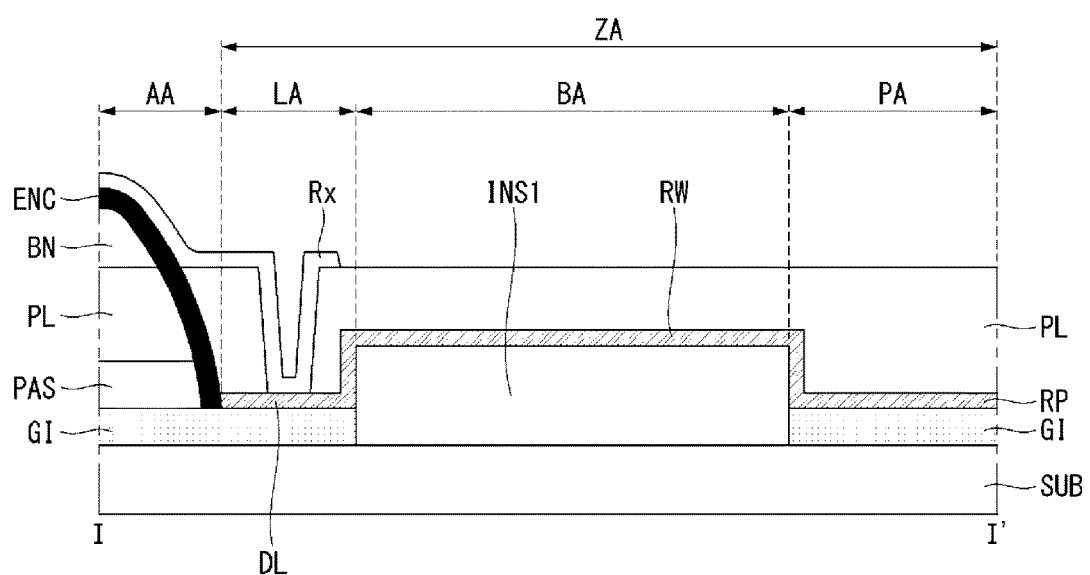
FIG. 2 is a cross-sectional view taken along line I-I' of FIG. 1.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of that may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Hereinafter, a flexible electroluminescence display device according to an embodiment of the present disclosure will be described with reference to FIGS. 3 and 4.

Figure 3:
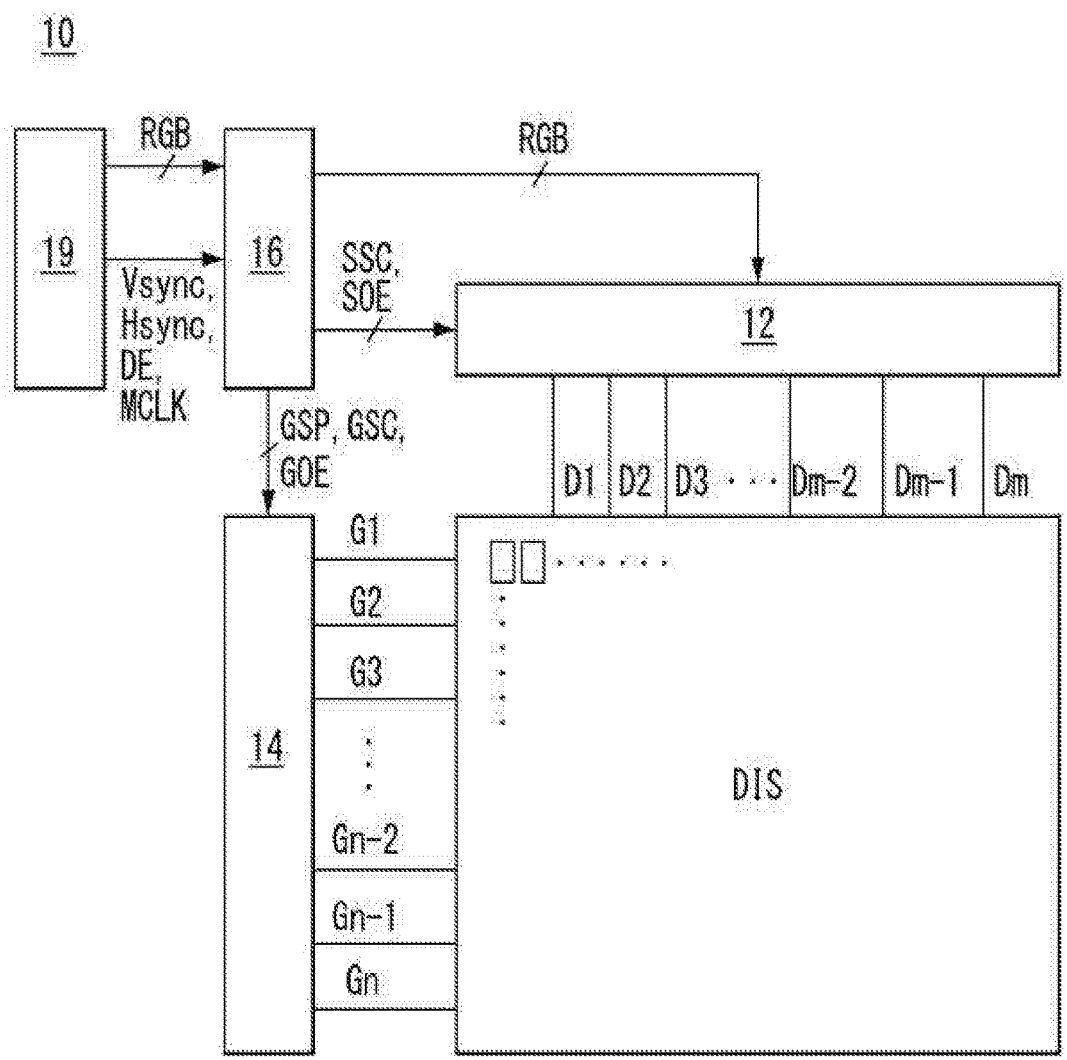
FIG. 3 is a plan view showing a flexible electroluminescent display device having a touch sensor according to an embodiment of the present disclosure.

FIG. 3 is a plan view showing a flexible electroluminescent display device having a touch sensor according to an embodiment of the present disclosure. FIG. 4 is a circuit diagram showing one pixel area of the display panel shown in FIG. 3.

With reference to FIG. 3, a flexible electroluminescent display device 10 may include display drive circuits 12, 14, and 16 and a display panel DIS. The display driving circuits 12, 14, and 16 may include a data driving circuit 12, a gate driving circuit 14 and a timing controller 16. The display driving circuits 12, 14, and 16 may write video data voltages of an input image to pixels of the display panel DIS. The data driving circuit 12 may convert digital video data RGB input from the timing controller 16 into analog gamma compensation voltages to generate data voltages. The data voltages output from the data driving circuit 12 may be supplied to the data lines D1 to Dm. The gate driving circuit 14 may sequentially supply gate pulses synchronized with the data voltages to the gate lines G1 to Gn to select the pixels of the display panel DIS to which the data voltages are written.

The timing controller 16 may control operation timings of the data driving circuit 12 and the gate driving circuit 14 using timing signals, such as a vertical synchronization signal Vsync, a horizontal synchronization signal Hsync, a data enable signal DE, and a main clock signal MCLK, which may be received from a host system 19. The data timing control signal for controlling the data driving circuit 12 may include a source sampling clock SSC, a source output enable signal SOE, and so on. The gate timing control signal for controlling the gate driving circuit 14 may include a gate start pulse GSP, a gate shift clock GSC, a gate output enable signal GOE, and so on.

The host system 19 may be implemented, for example, by a television system, a set-top box, a navigation system, a DVD player, a blue-ray player, a personal computer (PC), a home theater system, a phone system, and so on. The host system 19 may include a system on chip (SoC) with a built-in scaler to convert the digital video data RGB of the input image into a format suitable for display on the display panel DIS. The host system 19 may transmit the timing signals Vsync, Hsync, DE, and MCLK to the timing controller 16 together with the digital video data.

The pixel array of the display panel DIS may include pixels defined by data lines D1 to Dm (where m is a positive integer) and gate lines G1 to Gn (where n is a positive integer). Each of the pixels may include an organic light-emitting diode OLE which is a self-light-emitting element.

Figure 4:
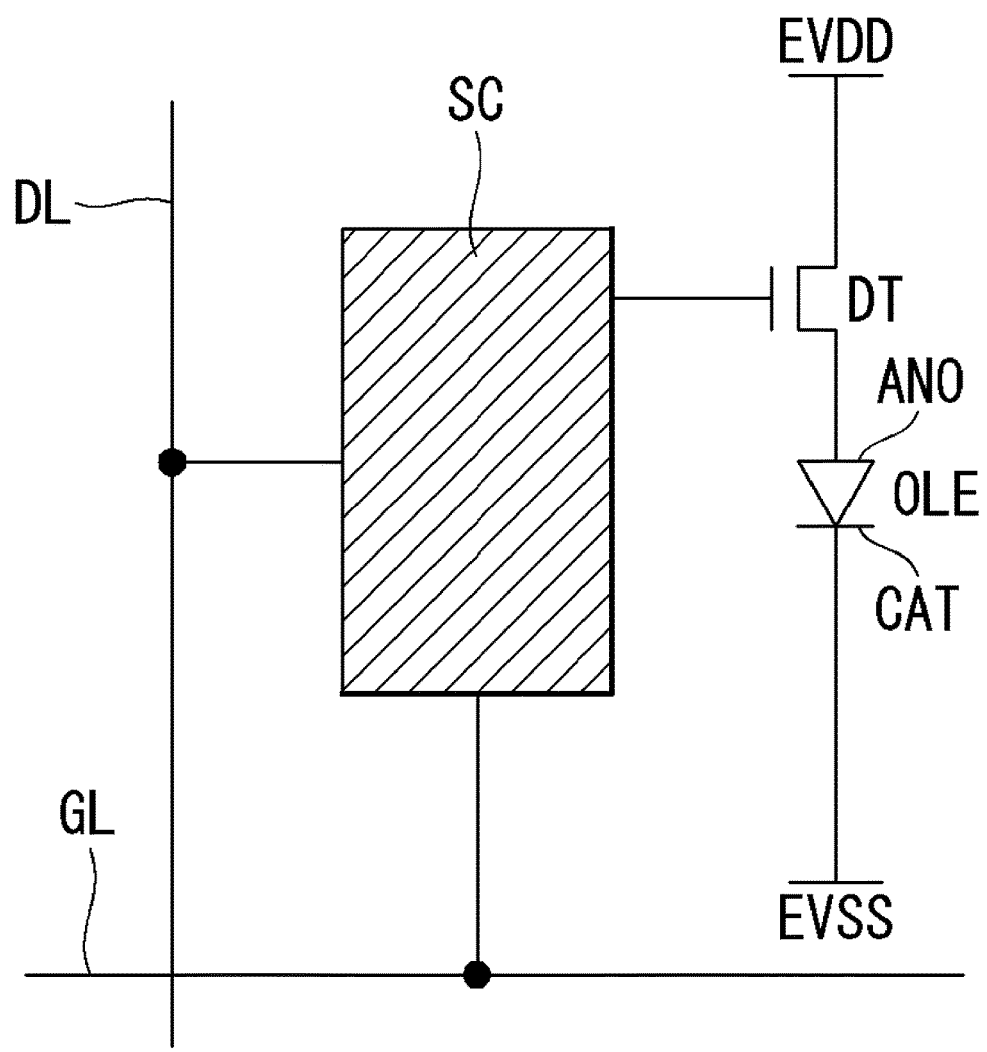
FIG. 4 is a circuit diagram showing one pixel area of the display panel shown in FIG. 3.

With reference to FIG. 4, in the display panel DIS, a data line DL and a gate line GL may cross over each other, and a pixel may be disposed in an area defined by the crossing. Accordingly, pixels having a matrix form may be arranged in the display panel DIS. Each pixel may include an organic light-emitting diode OLE, a driving thin film transistor (hereinafter, referred to as a "driving TFT") DT for controlling an amount of current flowing in the organic light-emitting diode OLE, and a programming unit SC for setting the voltage between a gate electrode and a source electrode of the driving TFT DT.

The programming portion SC may include at least one switching TFT and at least one storage capacitor. The switching TFT may be turned on in response to a scan signal from the gate line GL, thereby applying a data voltage from the data line DL to one electrode of the storage capacitor.

The driving TFT DT may control the amount of current supplied to the organic light-emitting diode OLE according to the magnitude of the voltage charged in the storage capacitor to control the amount of light emitted from the organic light-emitting diode OLE. The amount of light emission of the organic light-emitting diode OLE may be proportional to the amount of current supplied from the driving TFT DT. Each pixel may be connected to a high potential voltage source and a low potential voltage source, and may be supplied with a high potential voltage EVDD and a low potential voltage EVSS from a power generation unit (not shown).

The TFTs in the pixel may be implemented as p-type or n-type. Further, the semiconductor layer of the TFTs in the pixel may include, for example, amorphous silicon, polysilicon, or an oxide. The organic light-emitting diode OLE may include an anode electrode ANO, a cathode electrode CAT, and an organic light-emitting layer interposed between the anode electrode ANO and the cathode electrode CAT. The anode electrode ANO may be connected to the driving TFT DT. The organic light-emitting layer may include an emission layer (EML), a hole injection layer (HIL), a hole transport layer (HTL), an electron transport layer (ETL), and an electron injection layer (EIL). The emission layer (EML) may be disposed between a hole layer including the hole injection layer (HIL) and the hole transport layer (HTL), and an electron layer including the electron transport layer (ETL) and the electron injection layer (EIL).

A flexible electroluminescence display device according to a first embodiment of the present disclosure will be described with reference to FIGS. 5 to 6B.

Figure 5:
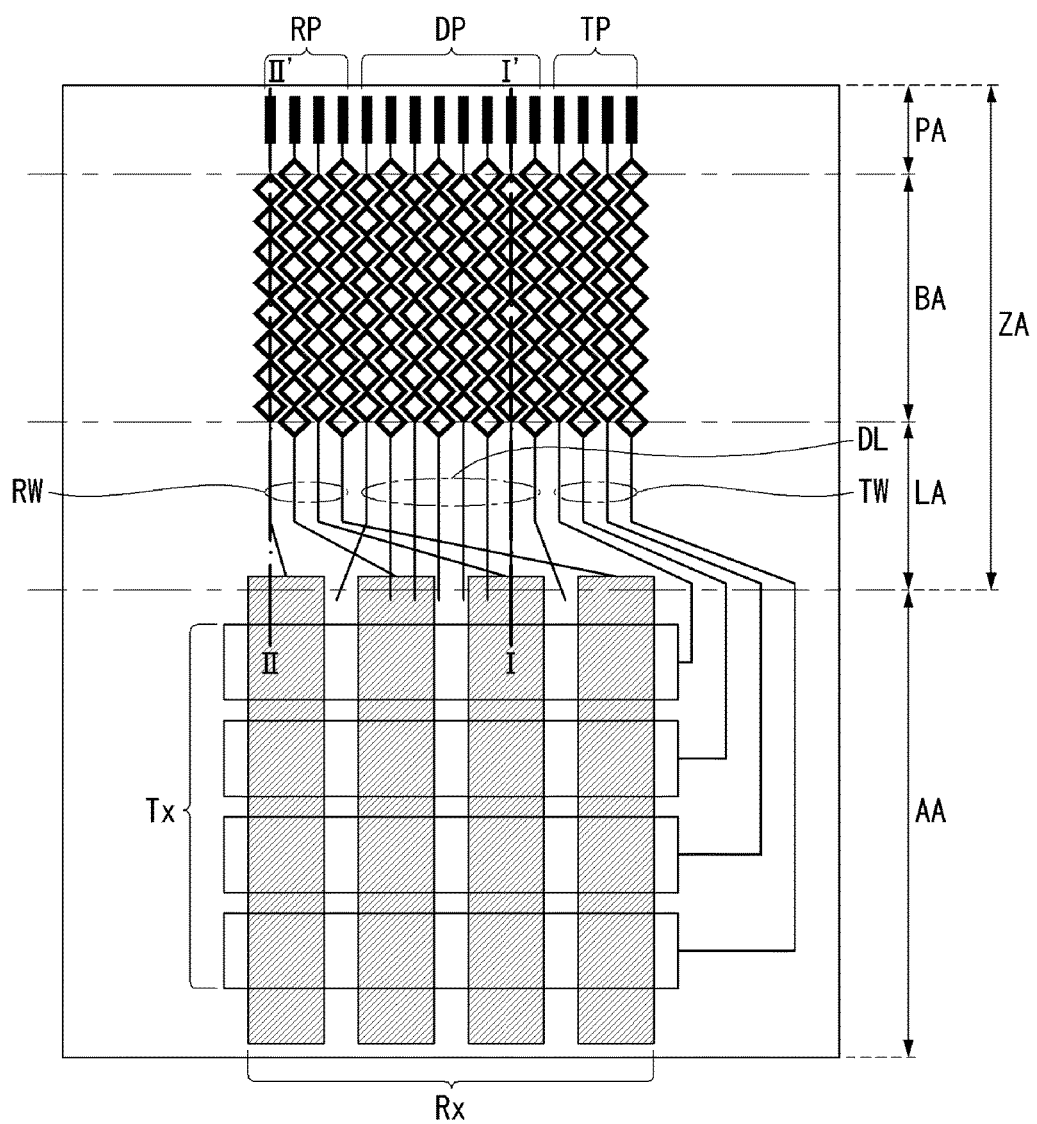
FIG. 5 is a plan view showing a first embodiment of the flexible electroluminescence display device shown in FIG. 4.
Figure 6A:
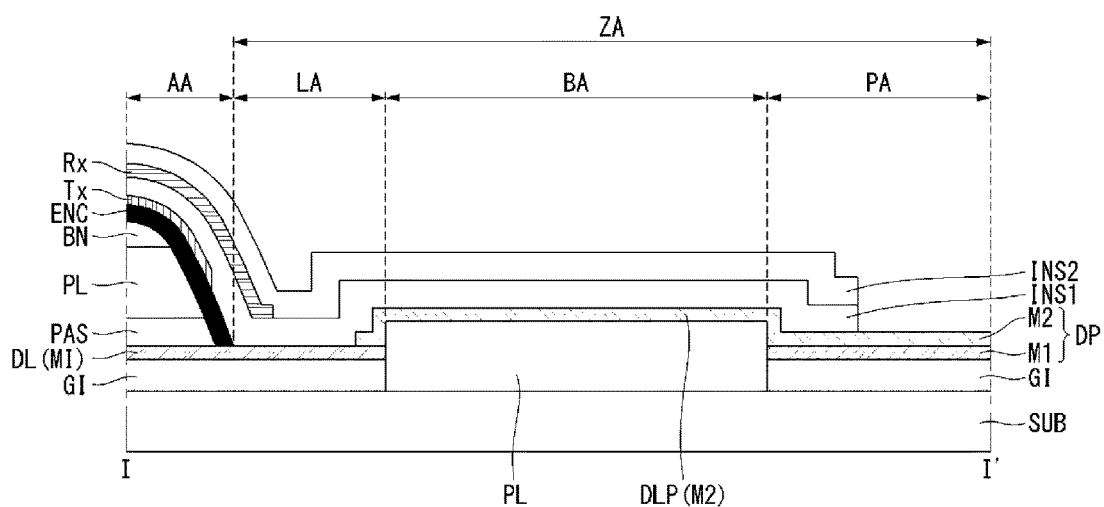
FIG. 6A is a cross-sectional view taken along line I-I' of FIG. 5.

FIG. 5 is a plan view showing a first embodiment of the flexible electroluminescence display device shown in FIG. 4. FIG. 6A is a cross-sectional view taken along line I-I' of FIG. 5. FIG. 6B is a cross-sectional view taken along line II-II' of FIG. 5.

The flexible electroluminescent display device according to the first embodiment of the present disclosure may include an active area AA and a bezel area ZA outside the active area AA. The example of FIG. 6A illustrates a configuration of a data line DL and a data pad DP arranged in an active area AA and a bezel area ZA. The bezel area ZA includes a link area LA, a bending area BA, and a pad area PA.

The active area AA may be an area in which an input image is displayed and information is input through a touch or proximity of an object, such as a finger or a stylus pen. There may be display elements (for example, gate lines, data lines, thin film transistors, storage capacitors, organic light-emitting diodes, and so on) for displaying an input image, and a touch sensor for sensing a touch in the active area AA.

The active area AA, in which the display elements may be disposed, may include a gate insulation layer GI covering the gate lines and gate electrodes of thin film transistors, a passivation film PAS covering source and drain electrodes of the thin film transistors and data lines formed on the gate insulation layer GI, a planarization layer PL formed on the passivation film PAS, and a bank BN formed to expose the organic light-emitting diodes (not shown) disposed on the planarization layer PL. An encapsulation layer ENC may be disposed on the bank BN to prevent moisture from permeating from the outside.

The substrate SUB is a flexible substrate having flexibility. For example, the substrate SUB may be a film type made of a flexible material selected from a group of a polyester-based polymer, a silicon-based polymer, an acrylic polymer, a polyolefin-based polymer, and copolymers thereof. For example, the flexible substrate may include one of: polyethylene terephthalate (PET), polybutylene terephthalate (PBT), polysilane, polysiloxane, polysilazane, polycarbosilane, polyacrylate, polymethacrylate, polymethyl acrylate, polyethylacrylate, polyethylmetacrylate, cyclic olefin co-polymeric cyclic (COC), cyclic olefin polymer (COP), polyethylene (PE), polypropylene (PP), polyimide (PI), polymethylmethacrylate (PMMA), polystyrene (PS), polyoxymethylene (POM), polyetheretherketone (PEEK), polyestersulfone (PES), polytetrafluoroethylene (PTFE), polyvinyl chloride (PVC), polycarbonate (PC), polyvinylidene fluoride (PVDF), perfluoroalkyl polymer (PFA), styreneacrylonitrile copolymer (SAN), and a combination thereof.

The gate insulation layer GI and the passivation film PAS may be formed of an inorganic insulation material, such as silicon nitride or silicon oxide. The planarization layer PL may flatten the top of the substrate SUB. The planarization layer PL may be a resin, such as, polyacrylate-based resin, epoxy resin, phenolic resin, polyamide-based resin, polyimide-based resin, unsaturated polyester-based resin, polyphenylenether-based resin, poly-phenylenesulfide-based resin, and/or benzocyclobutene. However, the planarization layer PL is not limited thereto, and can be formed of various materials.

A touch sensor may be formed on the encapsulation layer ENC. The touch sensor may include a plurality of first touch electrodes Tx arranged in parallel along a first direction, and a plurality of second touch electrodes Rx arranged in parallel along a second direction crossing the first direction. A first insulation layer INS1 made of an organic insulation material may be disposed entirely between the first touch electrodes Tx and the second touch electrodes Rx, or may be disposed only at the crossings thereof. A second insulation layer INS2 may be disposed on the first insulation layer INS1 to cover the second touch electrode Rx. The first touch electrodes Tx and the second touch electrodes Rx may be formed of a transparent conductive material, such as indium tin oxide (ITO), indium zinc oxide (IZO), or gallium-doped zinc oxide (GZO).

The link area LA may have data lines DL, first routing wires TW, and second wires RW therein. Each of the data lines DL may be extending from the active area AA, and may include a first metal layer M1. Each of the first routing wires TW may be connected to each of the first touch electrodes Tx, and each of the second wires RW may be connected to each of the second touch electrode Rx. The first and second routing wires TW and RW may be formed of a second metal layer M2. In the link area LA, the first touch electrode Tx may be connected to the first routing wire TW on the gate insulation layer GI, and the second touch electrode Rx may be connected to the second routing wire RW exposed through a contact hole passing through the first insulation layer INS1.

Figure 6B:
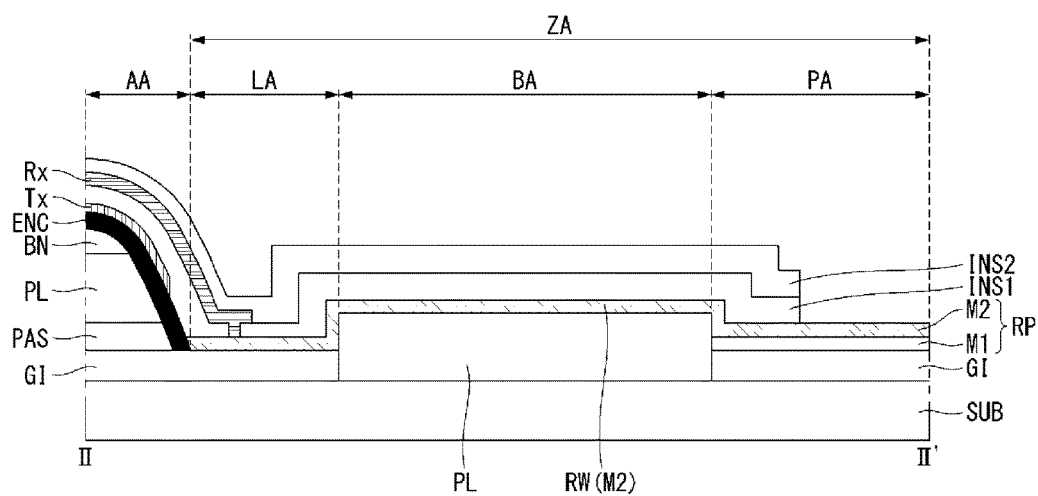
FIG. 6B is a cross-sectional view taken along line II-II' of FIG. 5.

In the examples of FIGS. 6A and 6B, the first insulation layer INS1 is an organic insulation layer for insulation the first touch electrodes Tx and the second touch electrodes Rx, and the second insulation layer INS2 is an organic insulation layer for protecting the second touch electrodes Rx. The first and second insulation layers INS1 and INS2 may be formed using the same material as the planarization layer PL.

The bending area BA may include the planarization layer PL, data link patterns DLP, and first and second routing wires TW and RW therein. The planarization layer PL in the bending area BA may be disposed on the substrate SUB, and may be the same as the planarization layer PL in the active area AA because the planarization layer PL in the bending area BA may be formed together with the planarization layer PL in the active area AA. The data link patterns DLP may be disposed on the planarization layer PL in the bending area BA and one portion of the data lines DL in the link area LA. Accordingly, the data link patterns DLP can be connected to the data lines DL formed of the first metal layer M1. The data link patterns DLP may be formed of the second metal layer M2. The first and second routing wires TW and RW may be connected to the first and second touch electrodes Tx and Rx, respectively, although the FIG. 6B example shows only the second routing wire RW. The first and second routing wires TW and RW may also be formed of the second metal layer M2. The first and second routing wires TW and RW, as well as the data link patterns DLP, may be parallel with each other in the bending area BA.

The pad area PA may include pads for receiving signals supplied from the outside or for supplying signals transmitted from the active area AA. The pads may include data pads DP, first touch pads TP, and second touch pads RP. The example of FIG. 6B illustrates a second routing wire RW and a second touch pad RP in the bezel area ZA connected to a second touch electrode Rx disposed in the active area AA.

Each of the data pads DP may be disposed on the gate insulation film GI, and may include the first metal layer M1 and the second metal layer M2 on the first metal layer M1. The first metal layer M1 of the data pad DP may be formed at the time, e.g., in a same operation or process, of forming the data lines DL, and the second metal layer M2 of the data pad DP may be extending from the data link pattern DLP of the bending area BA.

Each of the first and second touch pads TP and RP may include the first metal layer M1 on the gate insulation layer GI, and a second metal layer M2 on the first metal layer M1. The second metal layer M2 of the first touch pad TP may be extending from the second metal layer M2 of the first routing wire TW. The second metal layer M2 of the second touch pad RP may be extending from the second metal layer M2 of the second routing wire RW.

The first and second metal layers M1 and M2 may be formed of a conductive material. The first and second metal layers M1 and M2 may be formed of a conductive material having excellent ductility to minimize occurrence of a crack when the substrate SUB is bent. For example, each of the first and second metal layers M1 and M2 may be formed of a conductive material having excellent ductility, such as gold (Au), silver (Ag), and/or aluminum (Al). However, the material forming the first and second metal layers M1 and M2 is not limited thereto. For example, the material may be one of: molybdenum (Mo), chromium (Cr), titanium (Ti), nickel (Ni), neodymium (Nd), copper (Cu), magnesium (Mg), and an alloy thereof.

In a electroluminescent display device according to the first embodiment of the present disclosure, the first insulation layer INS1 and the planarization layer PL made of an organic insulation material may be respectively disposed at the upper and lower sides of the data link pattern DLP, the first routing wire TW and the second routing wire RW, thereby increasing the flexibility of the electroluminescent display device. Therefore, it may be possible to better suppress occurrence of cracks, e.g., maximally, because the stresses applied to the data link pattern DLP, the first routing wire TW, and the second routing wire RW may be reduced.

Also, the planarization layer PL between the substrate SUB and the second metal layer M2 in the bending area BA may be formed by a same process as the planarization layer PL in the active area AA. It may be possible to obtain an effect of reducing or eliminating one mask process, as compared with the related art.

A flexible electroluminescence display device according to a second embodiment of the present disclosure will be described with reference to FIGS. 7 to 8B.

Figure 7:
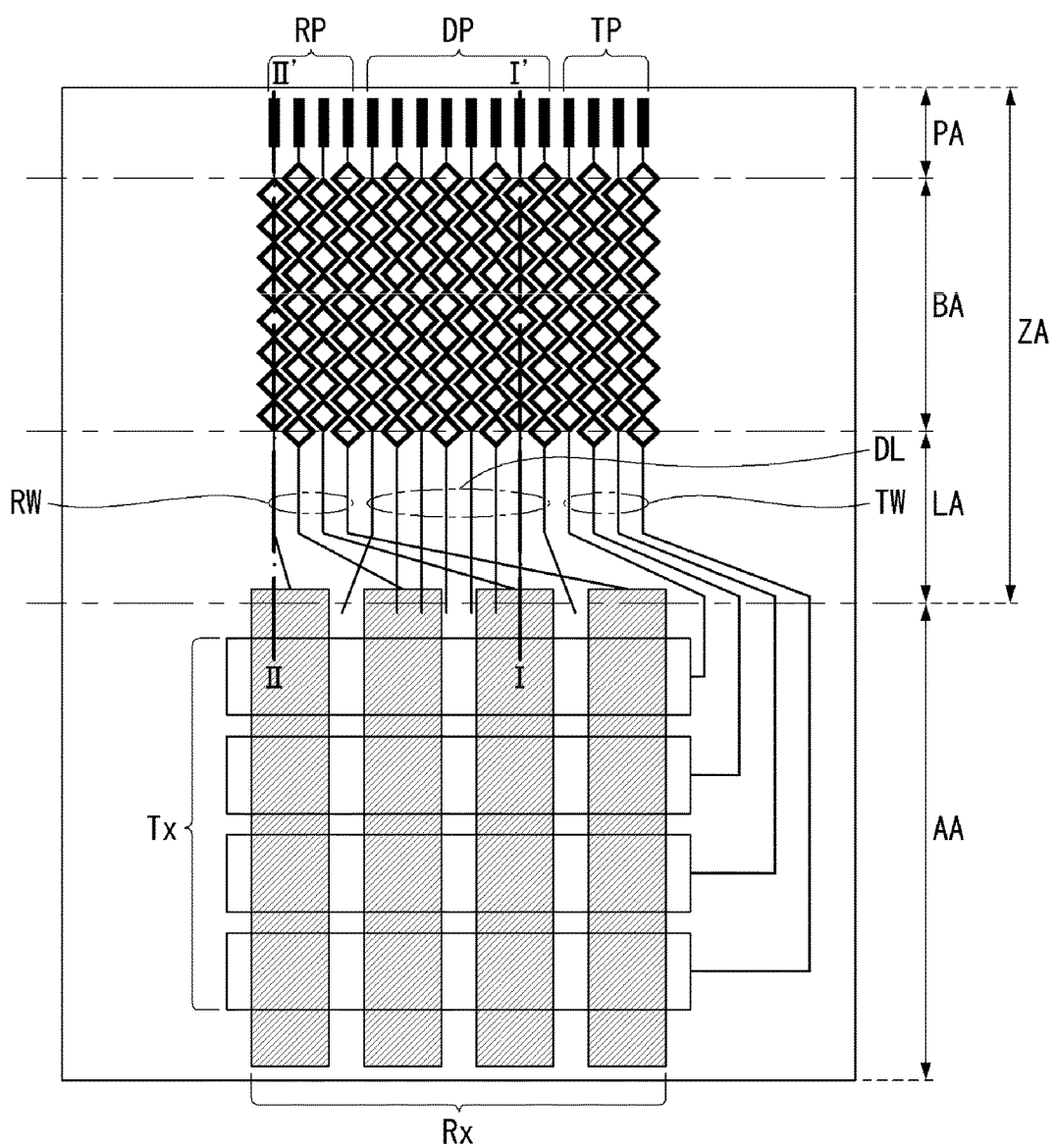
FIG. 7 is a plan view showing a second embodiment of the flexible electroluminescence display device shown in FIG. 4.
Figure 8A:
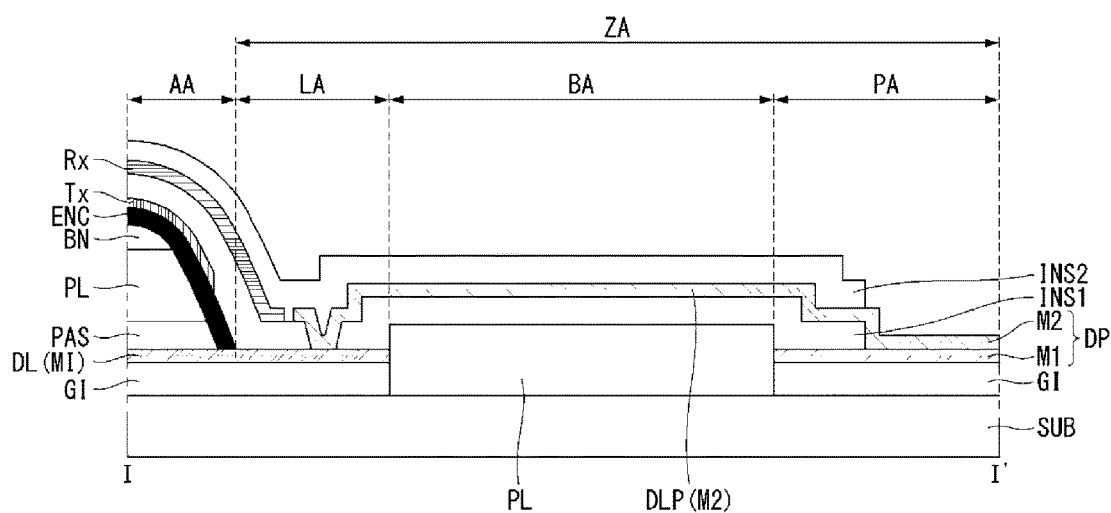
FIG. 8A is a cross-sectional view taken along line I-I' of FIG. 7.

FIG. 7 is a plan view showing a second embodiment of the flexible electroluminescence display device shown in FIG. 4. FIG. 8A is a cross-sectional view taken along line I-I' of FIG. 7. FIG. 8B is a cross-sectional view taken along line II-II' of FIG. 7.

A flexible electroluminescent display device according to the second embodiment of the present disclosure may include an active area AA and a bezel area ZA outside the active area AA. The example of FIG. 8A illustrates a configuration of a data line DL, a data link pattern DLP, and a data pad DP arranged in the active area AA and the bezel area ZA. The bezel area ZA may include a link area LA, a bending area BA, and a pad area PA.

The active area AA may be an area in which an input image is displayed and information is input through a touch or proximity of an object such as a finger or a stylus pen. There may be display elements (for example, gate lines, data lines, thin film transistors, storage capacitors, organic light-emitting diodes, and so on) for displaying an input image, and a touch sensor for sensing a touch in the active area AA.

The active area AA, in which the display elements are disposed, may include a gate insulation layer GI covering the gate lines and gate electrodes of thin film transistors, a passivation film PAS covering source and drain electrodes of the thin film transistors and data lines formed on the gate insulation layer GI, a planarization layer PL formed on the passivation film PAS, and a bank BN formed to expose the organic light-emitting diodes (not shown) disposed on the planarization layer PL. An encapsulation layer ENC may be disposed on the bank BN to prevent moisture from permeating from the outside.

The substrate SUB is a flexible substrate having flexibility. For example, the substrate SUB may be a film type made of a flexible material, such as a polyester-based polymer, a silicon-based polymer, an acrylic polymer, a polyolefin-based polymer, and/or copolymers thereof. The flexible substrate can be formed using the same material as that of the flexible substrate of the first embodiment. The gate insulation layer GI and the passivation film PAS may be formed of an inorganic insulation material such as silicon nitride or silicon oxide.

The planarization layer PL may flatten the top of the substrate SUB. The same material as that described in the first embodiment can be used for the planarization layer PL.

A touch sensor may be formed on the encapsulation layer ENC. The touch sensor may include a plurality of first touch electrodes Tx arranged in parallel along a first direction, and a plurality of second touch electrodes Rx arranged in parallel along a second direction crossing the first direction. A first insulation layer INS1 made of an organic insulation material may be disposed entirely between the first touch electrodes Tx and the second touch electrodes Rx, or may be disposed only at the crossings thereof. A second insulation layer INS2 may be disposed on the first insulation layer INS1 to cover the second touch electrode Rx. The first touch electrodes Tx and the second touch electrodes Rx may be formed of a transparent conductive material, such as ITO, IZO, or GZO.

There may be data lines DL, data link patterns DLP, first routing wires TW and second wires RW in the link area LA. Each of the data lines DL may be extending from the active area AA, and may include a first metal layer M1. Each of the data link patterns DLP may be disposed on the first insulation layer INS1 covering the date line DL, and may be connected to the data line DL exposed through contact hole passing through the first insulation layer INS1. Each of the first routing wires TW may be connected to each of the first touch electrodes Tx. Each of the second wires RW may be connected to each of the second touch electrode Rx. The data link pattern DLP and the first and second routing wires TW and RW may be formed of a second metal layer M2.

In the link area LA, the first routing wire TW may be connected to the first touch electrode Tx exposed via a contact hole passing through the first insulation layer INS1. Also in the link area LA, the second routing wire RW may be directly connected to the second touch electrode Rx on the first insulation layer INS1.

Figure 8B:
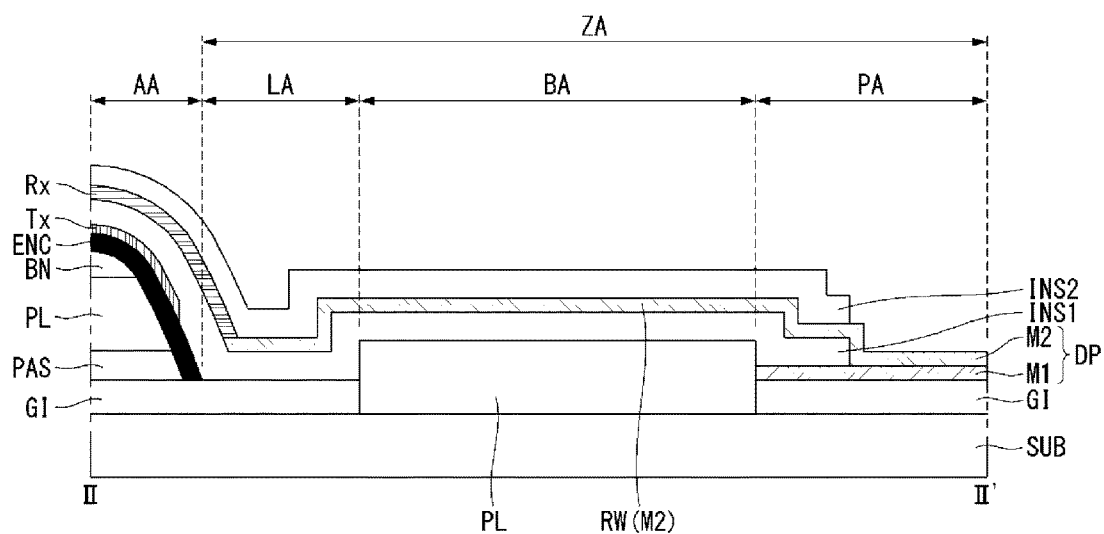
FIG. 8B is a cross-sectional view taken along line II-II' of FIG. 7.

In the examples of FIGS. 8A and 8B, the first insulation layer INS1 may be an organic insulation layer for insulation the first touch electrodes Tx and the second touch electrodes Rx, and the second insulation layer INS2 may be an organic insulation layer for protecting the second touch electrodes Rx. The first and second insulation layers INS1 and INS2 may be formed using the same material as the planarization layer PL.

The the planarization layer PL, data link patterns DLP, and first and second routing wires TW and RW may be in the bending area BA. The planarization layer PL in the bending area BA may be disposed on the substrate SUB, and may be the same as the planarization layer PL in the active area AA because the planarization layer PL in the bending area BA may be formed together with the planarization layer PL in the active area AA. The first insulation layer INS1 is disposed on the planarization layer PL. The data link patterns DLP may be disposed on the first insulation layer INS1 in the bending area BA, and may be extended to the link area LA and the pad area PA. The data link patterns DLP may be formed of the second metal layer M2. The first and second routing wires TW and RW may be respectively connected to the first and second touch electrodes Tx and Rx, although the FIG. 8B example shows only the second routing wire RW. The first and second routing wires TW and RW may also be formed of the second metal layer M2. The first and second routing wires TW and RW, as well as the data link patterns DLP, may be parallel with each other in the bending area BA.

The pad area PA may include pads for receiving signals supplied from the outside or for supplying signals transmitted from the active area AA. The pads may include data pads DP, first touch pads TP, and second touch pads RP. The example of FIG. 8B illustrates a second routing wire RW and a second touch pad RP in the bezel area ZA connected to a second touch electrode Rx disposed in the active area AA.

Each of the data pads DP may be disposed on the gate insulation film GI, and may include the first metal layer M1 and the second metal layer M2 on the first metal layer M1. The first metal layer M1 of the data pad DP may be formed at the time (e.g., in the same operation) of forming the data lines DL, and the second metal layer M2 of the data pad DP may be extending from the data link pattern DLP of the bending area BA.

Each of the first and second touch pads TP and RP may include the first metal layer M1 on the gate insulation layer GI and a second metal layer M2 on the first metal layer M1. The second metal layer M2 of the first touch pad TP may be extending from the second metal layer M2 of the first routing wire TW. The second metal layer M2 of the second touch pad RP may be extending from the second metal layer M2 of the second routing wire RW.

The first and second metal layers M1 and M2 may be formed of a conductive material. The first and second metal layers M1 and M2 may be formed of a conductive material having excellent ductility to minimize occurrence of a crack when the substrate SUB is bent. The first and second metal layers M1 and M2 may be formed using the same material as the first and second metal layers M1 and M2 of the first embodiment.

In the electroluminescent display device according to the second embodiment of the present disclosure, the second insulation layer INS2 and the first insulation layer INS1 made of an organic insulation material may be respectively disposed at the upper and lower sides of the data link pattern DLP, the first routing wire TW, and the second routing wire RW, thereby increasing the flexibility of the electroluminescent display device. Therefore, it may be possible to suppress occurrence of cracks (e.g., maximally) because the stresses applied to the data link pattern DLP, the first routing wire TW, and the second routing wire RW may be reduced.

Also, the planarization layer PL between the substrate SUB and the second metal layer M2 in the bending area BA may be formed by a same process as the planarization layer PL in the active area AA. It may be possible to obtain an effect of reducing one mask process, as compared with the related art.

A flexible electroluminescence display device according to a third embodiment of the present disclosure will be described with reference to FIGS. 9 to 10B.

Figure 9:
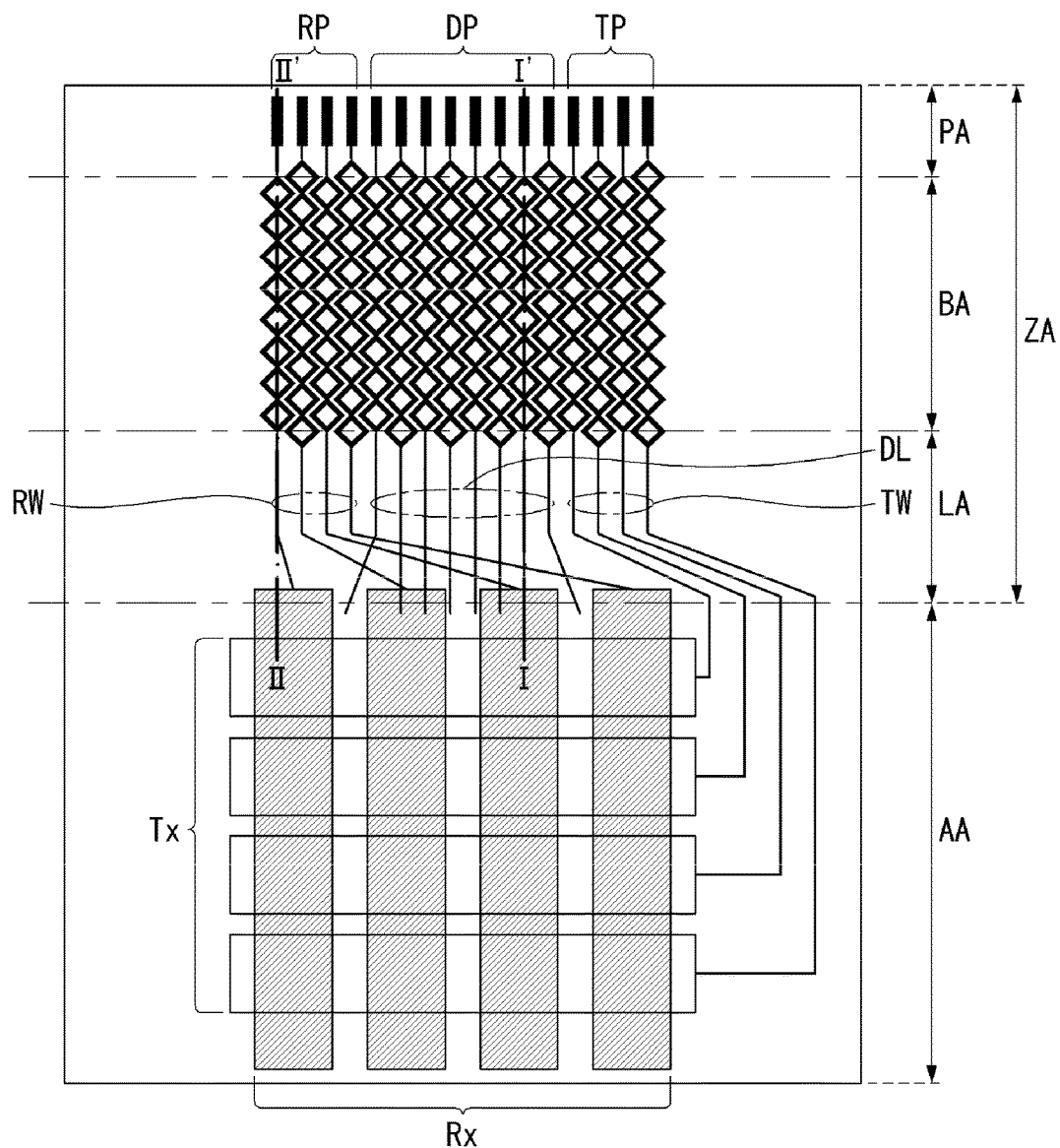
FIG. 9 is a plan view showing a third embodiment of the flexible electroluminescence display device shown in FIG. 4.
Figure 10A:
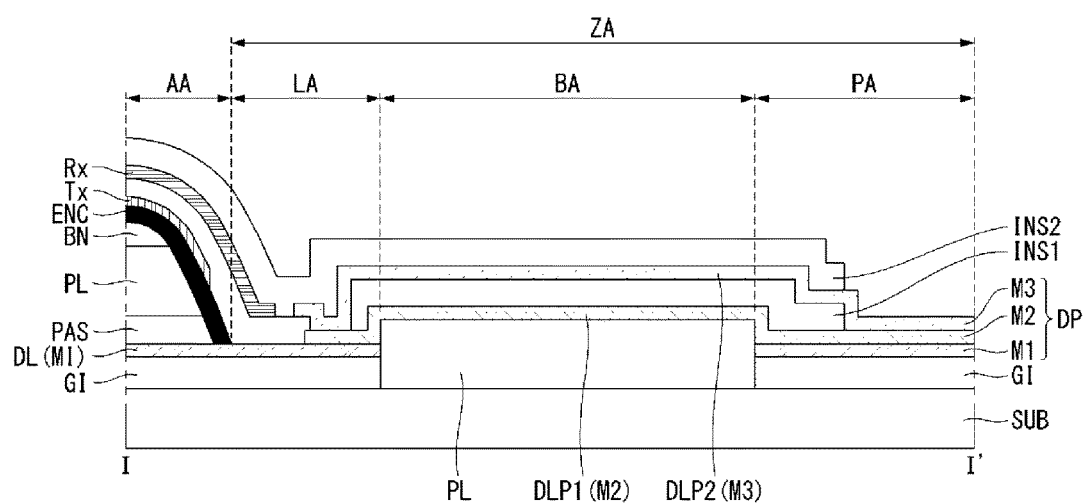
FIG. 10A is a cross-sectional view taken along line I-I' of FIG. 9.

FIG. 9 is a plan view showing a third embodiment of the flexible electroluminescence display device shown in FIG. 4. FIG. 10A is a cross-sectional view taken along line I-I' of FIG. 9. FIG. 10B is a cross-sectional view taken along line II-II' of FIG. 9.

The FIG. 10A example illustrates a configuration of a data line DL, first and second data link patterns DLP1 and DLP2, and a data pad DP arranged in the active area AA and the bezel area ZA. The FIG. 10B example illustrates a second routing wire RW and a second touch pad RP in the bezel area ZA connected to a second touch electrode Rx disposed in the active area AA.

A flexible electroluminescent display device according to the third embodiment of the present disclosure includes an active area AA and a bezel area ZA outside the active area AA. The bezel area ZA may include a link area LA, a bending area BA, and a pad area PA.

The active area AA may be an area in which an input image is displayed and information may be input through a touch or proximity of an object such as a finger or a stylus pen. There may be display elements (for example, gate lines, data lines, thin film transistors, storage capacitors, organic light-emitting diodes, and so on) for displaying an input image, and a touch sensor for sensing a touch in the active area AA.

In the active area AA, in which the display elements are disposed, there may be a gate insulation layer GI covering the gate lines and gate electrodes of thin film transistors, a passivation film PAS covering source and drain electrodes of the thin film transistors and data lines formed on the gate insulation layer GI, a planarization layer PL formed on the passivation film PAS, and a bank BN formed to expose the organic light-emitting diodes (not shown) disposed on the planarization layer PL. An encapsulation layer ENC may be disposed on the bank BN to prevent moisture from being permeated from the outside.

The substrate SUB is a flexible substrate having flexibility. For example, the substrate SUB may be a film type made of a flexible material, such as a polyester-based polymer, a silicon-based polymer, an acrylic polymer, a polyolefin-based polymer, and/or copolymers thereof. The flexible substrate can be formed using the same material as that of the flexible substrate of the first embodiment. The gate insulation layer GI and the passivation film PAS may be formed of an inorganic insulation material such as silicon nitride or silicon oxide.

The planarization layer PL may flatten the top of the substrate SUB. The same material as that described in the first embodiment can be used for the planarization layer PL.

A touch sensor may be formed on the encapsulation layer ENC. The touch sensor may include a plurality of first touch electrodes Tx, arranged in parallel along a first direction, and a plurality of second touch electrodes Rx, arranged in parallel along a second direction crossing the first direction. A first insulation layer INS1 made of an organic insulation material may be disposed entirely between the first touch electrodes Tx and the second touch electrodes Rx, or may be disposed only at the crossings thereof. A second insulation layer INS2 may be disposed on the first insulation layer INS1 to cover the second touch electrode Rx. The first touch electrodes Tx and the second touch electrodes Rx may be formed of a transparent conductive material, such as ITO, IZO, or GZO.

In the link area LA, there may be data lines DL, data link patterns DLP1 and DLP2 including two layers, first routing wires TW (not shown) including two layers, and second routing wires RW1 and RW2 including two layers. Each of the data lines DL may be extending from the active area AA, and may be made of a first metal layer M1. Each of the data link patterns may include a first data link pattern DLP1 and a second data link pattern DLP2. The first data link pattern DLP1 may be disposed on the data line DL in the link area LA. The second data link pattern DLP2 may be disposed on the first insulation layer INS1 covering the first data link pattern DLP1, and may be connected to the first data link pattern DLP1 exposed through a contact hole passing through the first insulation layer INS1.

Each of the second routing wires RW may include a first wire layer RW1 and a second wire layer RW2. The first data link pattern DLP1 may be disposed on the data line DL in the link area LA. The first wire layer RW1 of the second routing wire RW may be disposed on the gate insulation layer GI in the link area LA. The second wire layer RW2 of the second routing wire RW may be disposed on the first insulation layer INS1 covering the first wire layer RW1 of the second routing wire RW, and may be connected to the first wire layer RW1 of the second routing wire RW exposed through a contact hole passing through the first insulation layer INS1. The second wire layer RW2 of the second routing wire RW may also be directly connected to the second touch electrode Rx on the first insulation layer. Each of the first routing wires TW may include a first wire layer and a second wire layer (not shown), similar to the second routing wires RW. The first wire layer of the first routing wire TW may be directly connected to the first touch electrode Tx in the link area LA. The first data link pattern DLP1, the first wire layer of the first routing wire TW, and the first wire layer RW1 of the second routing wire RW may be made of a second metal layer M2. The second data link pattern DLP2, the second wire layer of the first routing wire TW, and the second wire layer RW2 of the second routing wire RW may be made of a third metal layer M3.

Figure 10B:
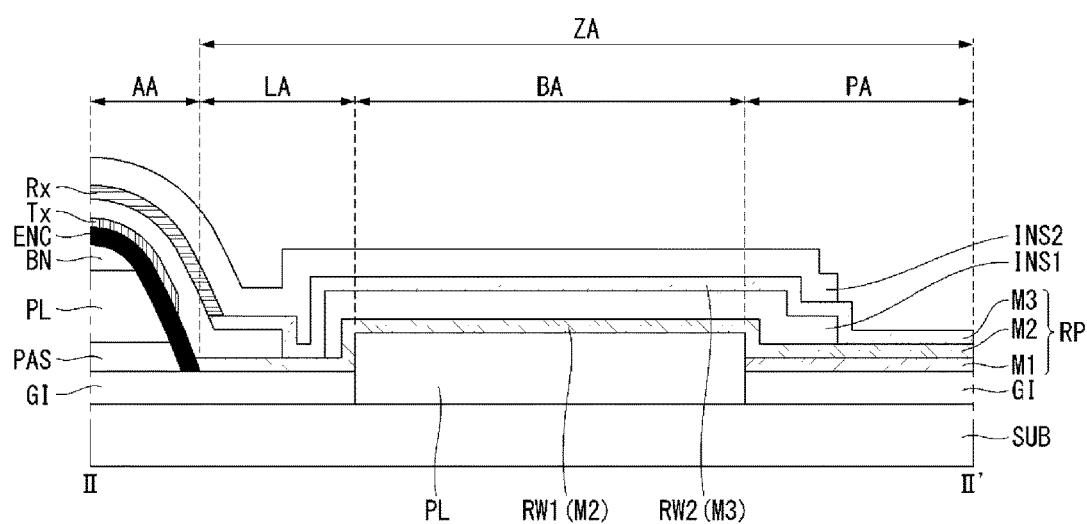
FIG. 10B is a cross-sectional view taken along line II-II' of FIG. 9.

In the examples of FIGS. 10A and 10B, the first insulation layer INS1 may be an organic insulation layer for insulation the first touch electrodes Tx and the second touch electrodes Rx, and the second insulation layer INS2 may be an organic insulation layer for protecting the second touch electrodes Rx. When the first insulation film INS1 may be formed only at the crossings of the first and second touch electrodes Tx and Rx, the second insulation film INS2 may be omitted in the link area LA, the bending area BA, and the pad area PA. The first and second insulation layers INS1 and INS2 may be formed using the same material as the planarization layer PL.

In the bending area BA, there may be the planarization layer PL, data link patterns DLP1 and DLP2 including two layers, first routing wires TW (not shown) including two layers, and second routing wires RW1 and RW2 including two layers. The planarization layer PL in the bending area BA may be disposed on the substrate SUB, and may be the same as the planarization layer PL in the active area AA because the planarization layer PL in the bending area BA may be formed together with the planarization layer PL in the active area AA. The first data link pattern DLP1, the first wire layer of the first routing wire TW, and the first wire layer RW1 of the second routing wire extending from the link area LA may be disposed on the planarization layer PL. The second data link pattern DLP2, the second wire layer of the first routing wire TW, and the second wire layer RW2 of the second routing wire extending from the link area LA may be disposed on the first insulation layer INS1 covering the first data link pattern DLP1, the first wire layer of the first routing wire TW, and the first wire layer RW1 of the second routing wire. The data link patterns DLP1 and DLP2, the first routing wires TW, and the second routing wires RW1 and RW2 may be extended to the pad area PA. The first data link pattern DLP1, the first wire layer of the first routing wire TW, and the first wire layer RW1 of the second routing wire may be formed of the second metal layer M2. The second data link pattern DLP2, the second wire layer of the first routing wire TW, the second wire layer RW2 of the second routing wire may be made of the third metal layer M3. The first data link pattern DLP1, the first wire layer of the first routing wire TW, and the first wire layer RW1 of the second routing wire may be parallel with each other on the planarization layer PL. The second data link pattern DLP2, the second wire layer of the first routing wire TW, and the second wire layer RW2 of the second routing wire may be parallel with each other on the first insulation layer INS1.

The pad area PA may include pads for receiving signals supplied from the outside, or for supplying signals transmitted from the active area AA. The pads may include data pads DP and first touch pads TP and second touch pads RP.

Each of the data pads DP may be disposed on the gate insulation film GI, and may include the first metal layer M1, the second metal layer M2 extending from the link area LA on the first metal layer M1, and the third metal layer M3 extending from the link area LA on the second metal layer M2. That is, each of the data pads may include three layers in which the first to third metal layers M1 to M3 may be sequentially disposed on the gate insulation layer GI.

Each of the first and second touch pads TP and RP may include the first metal layer M1 on the gate insulation layer GI extending from the link area LA, the second metal layer M2 extending from the link area LA on the first metal layer M1, and the third metal layer M3 extending from the link area LA on the second metal layer M3. That is, each of the first and second touch pads TP and RP may include three layers in which the first to third metal layers M1 to M3 may be sequentially disposed on the gate insulation layer GI.

The first to third metal layers M1, M2, and M3 may be formed of a conductive material, and may be formed of a conductive material having excellent ductility to reduce or minimize occurrence of cracks when the substrate SUB is bent. The first to third metal layers M1, M2, and M3 may be formed using the same material as the first and second metal layers M1 and M2 of the first embodiment.

In the electroluminescent display device according to the third embodiment of the present disclosure, the first insulation layer INS1 and the planarization layer PL made of an organic insulation material may be disposed at the upper and lower sides of each the first data link pattern DLP1, the first wire layer (not shown) of the first routing wire TW, and the first wire layer RW1 of the second routing wire RW. The second insulation layer INS2 and the first insulation layer INS1 made of an organic insulation material may be disposed at the upper and lower sides of each the second data link pattern DLP2, the second wire layer of the first routing wire TW, and the second wire layer RW2 of the second routing wire RW. This configuraiton may increase the flexibility of the electroluminescent display device. Therefore, it may be possible to suppress occurrence of cracks (e.g., maximally) because the stresses applied to the first and second data link patterns DLP1 and DLP2, the first and second wire layers of the first routing wire TW, and the first and second wire layers RW1 and RW2 of the second routing wire RW may be reduced.

Also, each of the data link pattern DLP, the first routing wire TW, and the second routing wire RW located in the bending area BA may have a two-layer structure. That is, the data link pattern DLP may have a two-layer structure of the first data link pattern DLP1 and the second data link pattern DLP, the first routing wire TW may have a two-layer structure of the first layer and the second layer (not shown), and the second routing wire RW may have a two-layer structure of the first layer RW1 and the second layer RW2. Therefore, when a bending occurs in the bending area BA, although a crack or a disconnection may occur at any one of the first data link pattern DLP1 and the second data link pattern DLP2, any one of the first layer and the second layer of the first routing wire (not shown), or any one of the first layer RW1 and the second layer RW2 of the second routing wire RW by stresses occurring due to the bending, the electric path may be maintained by the other one. Accordingly, it may be possible to reduce or prevent defects of the electroluminescent display device due to the crack or the disconnection.

Also, the planarization layer PL between the substrate SUB and the second metal layer M2 in the bending area BA may be formed by a same process as the planarization layer PL in the active area AA. It may be possible to obtain an effect of reducing one mask process as compared with the related art A first modification example of the flexible electroluminescence display device according to the third embodiment of the present disclosure will be described with reference to FIGS. 11A and 11B.

Figure 11A:
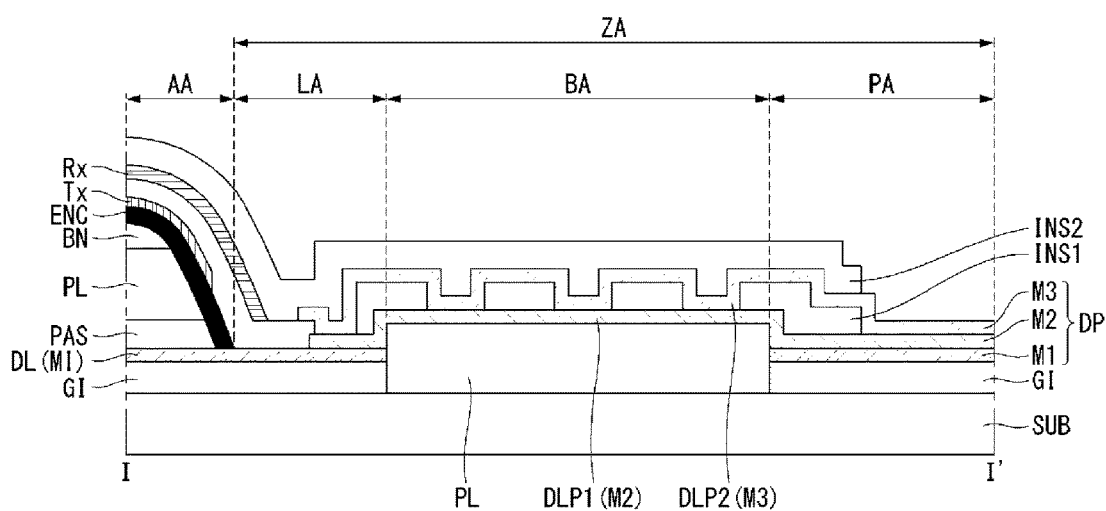
FIG. 11A is a cross-sectional view of a first modification example taken along the line I-I' of FIG. 9.
Figure 11B:
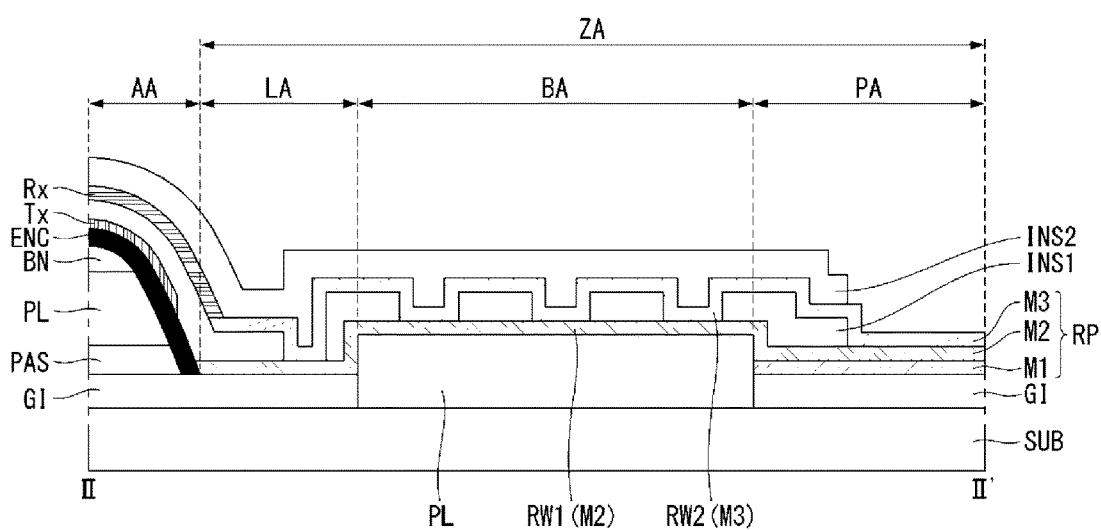
FIG. 11B is a cross-sectional view of a first modification example taken along the line II-II' of FIG. 9.

FIG. 11A is a cross-sectional view of a first modification example taken along the line I-I' of FIG. 9. FIG. 11B is a cross-sectional view of a first modification example taken along the line II-II' of FIG. 9.

The example of FIG. 11A illustrates a configuration of a data line DL, first and second data link patterns DLP1 and DLP2, and a data pad DP arranged in the active area AA and the bezel area ZA. The example of FIG. 11B illustrates a second routing wire RW and a second touch pad RP in the bezel area ZA connected to a second touch electrode Rx disposed in the active area AA. In the examples of FIGS. 11A and 11B, the first and second wire layers of the first routing wires TW and the first touch pad TP are omitted for convenience of explanation because they are similar to those of the second routing wires RW and the second touch pad RP described above.

The flexible electroluminescent display device according to the first modification example of the third embodiment of the present disclosure shown in FIGS. 11A and 11B is substantially similar to the third embodiment, except that the third metal layer M3 disposed in the bezel area ZA is connected to the second metal layer M2 through a plurality of contact holes passing through the first insulation layer INS1 in the bending area BA. For example, in the first modification example of the third embodiment of the present disclosure, the second data link pattern DLP2 disposed on the first insulation layer INS1 may be connected to the first data link pattern DLP1 through the contact holes passing through the first insulation layer INS1 in the bending area BA, and each of the second wire layers of the first and second touch routing wirings TW and RW disposed on the first insulation layer INS1 may be electrically connected to each of the first wire layers of the first and second touch routing wirings TW and RW through the contact holes passing through the first insulation layer INS1 in the bending area BA. Therefore, detailed duplicative description is omitted for convenience.

In the first modification example of the third embodiment of the present disclosure, even if the second metal layer M2 and the third metal layer M3 are disconnected at the same time by a crack or other defect, it may be possible to supply signals through various paths without going through the disconnection section because the third metal layer M3 may be connected to the second metal layer M2 at multiple positions through the plurality of contact holes. Therefore, according to the first modified example of the third embodiment of the present disclosure, it may be possible to achieve the effects obtainable in the third embodiment, and also to obtain a more stable effect of preventing the flexible electroluminescent display device from being failed by the occurrence of cracks due to the bending, as compared with the third embodiment.

A second modification example of the flexible electroluminescence display device according to the third embodiment of the present disclosure will be described with reference to FIGS. 12A and 12B.

Figure 12A:
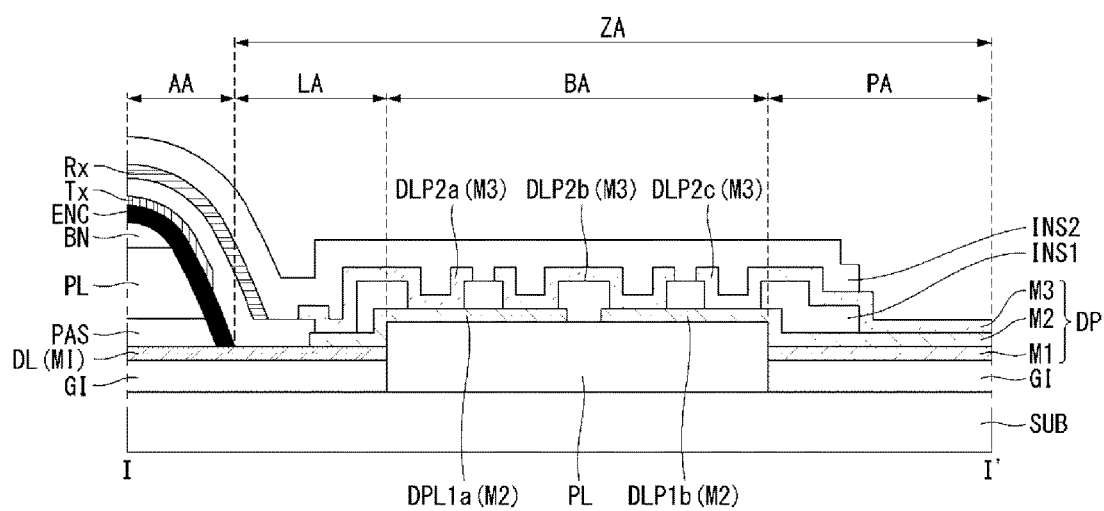
FIG. 12A is a cross-sectional view of a second modification example taken along the line I-I' of FIG. 9.

FIG. 12A is a cross-sectional view of a second modification example taken along the line I-I' of FIG. 9. FIG. 12B is a cross-sectional view of a second modification example taken along the line II-II' of FIG. 9.

The example of FIG. 12A illustrates a configuration of a data line DL, first and second data link patterns DLP1 and DLP2, and a data pad DP arranged in the active area AA and the bezel area ZA. The example of FIG. 12B illustrates a second routing wire RW and a second touch pad RP in the bezel area ZA connected to a second touch electrode Rx disposed in the active area AA. In the examples of FIGS. 12A and 12B, the first and second wire layers of the first routing wires TW and the first touch pad TP are omitted because they are similar to those of the second routing wires RW and the second touch pad RP described above.

Figure 12B:
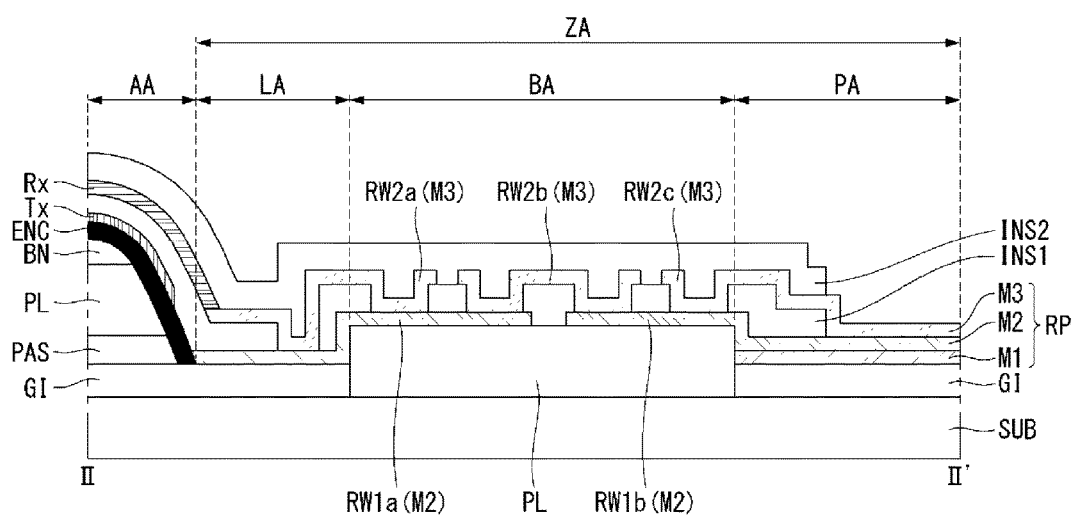
FIG. 12B is a cross-sectional view of a second modification example taken along the line II-II' of FIG. 9.

The flexible electroluminescent display device according to the second modification example of the third embodiment of the present disclosure shown in FIGS. 12A and 12B is different from the third embodiment in that the first data link pattern DLP1 made of the second metal layer M2 disposed on the planarization layer PL of the bezel area ZA includes a plurality of first data link patterns DLP1a and DLP1b separated from each other, the second data link pattern DLP2 made of a third metal layer M3 includes a plurality of second data link patterns DLP2a, the first data link patterns DLP1a and DLP1b are connected to each other by the second data link pattern DLP2b, and the second data link patterns DLP2a and DLP2b, and DLP2b and DLP2c are connected to each other by the first data link pattern DLP1a and DLP1b.

Also, the flexible electroluminescent display device according to the second modification example of the third embodiment of the present disclosure shown in FIGS. 12A and 12B is different from the third embodiment in that the first wire layer of the second routing wire RW made of the second metal layer M2 disposed on the planarization layer PL in the bezel area ZA includes a plurality of first wire pieces RW1a and RW1b separated from each other, the second wire layer of the second routing wire RW made of a third metal layer M3 includes a plurality of second wire pieces RW2a, RW2b and RW2c, the plurality of first wire pieces RW1a and RW1b are connected to each other by the second wire piece RW2b, and the plurality of second wire pieces RW2a, RW2b and RW2c are connected to each other by the first wire pieces RW1a and RW1b.

As described above, the flexible electroluminescent display device according to the second modified example of the third embodiment of the present disclosure is substantially similar to the third embodiment except for the above differences. Therefore, detailed duplicative description is omitted for convenience.

In the second modification example of the third embodiment of the present disclosure, even if the second metal layer M2 and the third metal layer M3 are disconnected at the same time by a crack or other defect, it is possible to supply signals through various paths without going through the disconnection section because the third metal layer M3 may be connected to the second metal layer M2 at multiple positions through the plurality of contact holes. Therefore, according to the second modification example of the third embodiment of the present disclosure, it may be possible to achieve the effects obtainable in the third embodiment, and also to obtain a more stable effect of preventing the flexible electroluminescent display device from being failed by the occurrence of cracks due to the bending, as compared with the third embodiment.

Those skilled in the art will understand that the present invention may be changed and modified in various ways without departing from the technical spirit of this disclosure through the aforementioned contents. For example, in the description of the embodiments of this disclosure, the data line and the touch routing wiring are described as examples of the signal lines arranged in the bezel area, but embodiments are not limited thereto. It should be understood that embodiments include all signal lines extending from the active area to the pad area to supply and receive various signals, such as a display signal, a power supply signal, a touch signal, and so on. The signal lines described in the claims do not only mean the data lines and the touch routing wiring, but have a meaning that includes signals mentioned above.

In the description of the embodiments, it is described that the first and second touch electrodes have a bar-shape. However, this description is not intended to limit embodiments, but merely illustrates one example for convenience of explanation. Accordingly, it is to be understood that embodiments are not limited thereto and include all known forms.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. An electroluminescent display device, comprising:
a substrate comprising:
an active area; and
a bezel area outside the active area and comprising a bending area;
a first organic insulation layer in the active area, the first organic insulation layer covering a first signal line extending from the active area to the bezel area;
a second organic insulation layer in the bending area, the second organic insulation layer being in a same layer as the first organic insulation layer;
first and second touch electrodes crossing over each other and sealing the active area on an encapsulation layer above the first organic insulation layer with a third organic insulation layer therebetween;
a first signal line link pattern connected to the first signal line, the first signal line link pattern being on the second organic insulation layer in the bending area; and
second and third signal lines respectively connected to the first and second touch electrodes, the second and third signal lines being on the second organic insulation layer in parallel with the first signal line link pattern,
wherein the bezel area further comprises:
a link area between the active area and the bending area, and
a pad area adjacent to the bending area,
wherein the first signal line link pattern is connected to the first signal line in the link area and extends to the bending area,
wherein the second signal line and the third signal line extend from the link area to the bending area,
wherein the first signal line comprises a first metal layer,
wherein the second signal line and the third signal line comprise a second metal layer, and
wherein the pad area comprises:
a first signal pad comprising:
a 1-1 metal layer in the pad area, and
a 2-1 metal layer on the 1-1 metal layer and connected to the first signal line in the link area,
a second signal pad comprising:
a 1-2 metal layer in the pad area, and
a 2-2 metal layer on the 1-2 metal layer and extending from the second signal line in the link area, and
a third signal pad comprising:
a 1-3 metal layer in the pad area, and
a 2-3 metal layer on the 1-3 metal layer and extending from the third signal line in the link area.

2. The electroluminescent display device of claim 1, wherein:
the third organic insulation layer covers the first touch electrode in the active area; and
the first signal line, the first signal line link pattern, the second signal line, and the third signal line extending from the active area in the bezel area.

3. The electroluminescent display device of claim 1, wherein the second organic insulation layer is formed at a time of forming the first organic insulation film.

4. An electroluminescent display device, comprising:
a substrate comprising:
an active area; and
a bezel area outside the active area and comprising a bending area;
a first organic insulation layer in the active area, the first organic insulation layer covering a first signal line extending from the active area to the bezel area;
a second organic insulation layer in the bending area, the second organic insulation layer being in a same layer as the first organic insulation layer;
first and second touch electrodes crossing over each other and sealing the active area on an encapsulation layer above the first organic insulation layer with a third organic insulation layer therebetween;

a first signal line link pattern connected to the first signal line on a third organic insulation layer covering the second organic insulation layer in the bending area; and second and third signal lines respectively connected to the first and second touch electrodes, the second and third signal lines being on the third organic insulation layer in parallel with the first signal line link pattern, wherein the bezel area further comprises:
a link area between the active area and the bending area, and
a pad area adjacent to the bending area, wherein the first signal line link pattern is connected to the first signal line in the link area through a contact hole through the third organic insulation layer, wherein the first signal line comprises a first metal layer, wherein the second signal line and the third signal line comprise a second metal layer, and wherein the pad area includes:
a first signal pad comprising:
a 1-1 metal layer in the pad area, and
a 2-1 metal layer on the 1-1 metal layer and connected to the first signal line in the link area,
a second signal pad comprising:
a 1-2 metal layer in the pad area, and
a 2-2 metal layer on the 1-2 metal layer and extending from the second signal line in the link area, and
a third signal pad comprising:
a 1-3 metal layer in the pad area, and
a 2-3 metal layer on the 1-3 metal layer and extending from the third signal line in the link area.

5. The electroluminescent display device of claim 4, further comprising:
a fourth organic insulation layer covering the first touch electrode in the active area,
wherein the first signal line link pattern, the second signal line, and the third signal line extend from the active area in the bezel area,
wherein the third organic insulation layer covers the second touch electrode in the active area, and
wherein the first signal line extends from the active area in the bezel area.

6. The electroluminescent display device of claim 4, wherein the second organic insulation layer is formed at a time of forming the first organic insulation film.

7. An electroluminescent display device, comprising:
a substrate comprising:
an active area; and
a bezel area outside the active area and including a bending area;
a first organic insulation layer in the active area, the first organic insulation layer covering a first signal line extending from the active area to the bezel area;
a second organic insulation layer in the bending area, the second organic insulation layer being in a same layer as the first organic insulation layer;
first and second touch electrodes crossing over each other and sealing the active area on an encapsulation layer above the first organic insulation layer with a third organic insulation layer therebetween;
a first signal line link pattern connected to the first signal line, the first signal line link pattern being on the second organic insulation layer in the bending area;
second and third signal lines respectively connected to the first and second touch electrodes, the second and third signal lines being on the second organic insulation layer in parallel with the first signal line link pattern;
a first signal line auxiliary link pattern on a third insulation layer covering the first signal link pattern and the second and third signal lines, the first signal line auxiliary link pattern being connected to the first signal line link pattern;
a second signal line auxiliary pattern connected to the second signal line;
a third signal line auxiliary pattern connected to the third signal line; and
a fourth organic insulation layer covering the first signal line auxiliary link pattern, and covering the second and third signal line auxiliary patterns.

8. The electroluminescent display device of claim 7, wherein:
the bezel area further comprises:
a link area between the active area and the bending area; and
a pad area adjacent to the bending area,
the first signal line link pattern is connected to the first signal line in the link area; and
the first signal line auxiliary link pattern is connected to the first signal line link pattern through a contact hole through the third organic insulation layer in the link area.

9. The electroluminescent display device of claim 8, wherein:
the first signal line comprises a first metal layer;
the second signal line and the third signal line comprise a second metal layer; and
the pad area comprises:
a first signal pad comprising:
a 1-1 metal layer in the pad area;
a 2-1 metal layer on the 1-1 metal layer and extending from the first signal line link pattern connected to the first signal line in the link area; and
a 3-1 metal layer extending from the first signal line auxiliary link pattern connected to the first signal line in the link area;
a second signal pad comprising:
a 1-2 metal layer in the pad area;
a 2-2 metal layer on the 1-2 metal layer and extending from the second signal line; and
a 2-3 metal layer on the 2-2 metal layer and extending from the second signal line auxiliary pattern connected to the second signal line in the link area; and
a third signal pad comprising:
a 1-3 metal layer in the pad area;
a 2-2 metal layer on the 1-3 metal layer and extending from the third signal line; and
a 3-3 metal layer on the 2-3 metal layer and extending from the third signal line auxiliary pattern connected to the third signal line in the link area.

10. The electroluminescent display device of claim 7, wherein:
the third organic insulation layer covers the first touch electrode in the active area;
the first signal line, the first signal line link pattern, the second signal line, and the third signal line extend from the active area in the bezel area; and
the fourth organic insulation layer covers the second touch electrode in the active area; and
the first signal line auxiliary link pattern and the second and third signal line auxiliary patterns extend from the active area in the bezel area.

11. The electroluminescent display device of claim 10, wherein:
  the first signal line auxiliary link pattern is connected to the first signal line link pattern through a plurality of contact holes through the third organic insulation layer in the bending area;
  the second signal line auxiliary pattern is connected to the second signal line through a plurality of contact holes through the third organic insulation layer in the bending area; and
  the third signal line auxiliary pattern is connected to the third signal line through a plurality of contact holes through the third organic insulation layer in the bending area.

12. The electroluminescent display device of claim 10, wherein:
  each of the second signal line and the second signal line auxiliary pattern are divided into a plurality in the bending area;
  the divided second signal lines are connected to each other by the divided second signal line auxiliary patterns;
  the divided second signal line auxiliary patterns are connected to each other by the divided second signal lines;
  each of the third signal line and the third signal line auxiliary pattern are divided into a plurality in the bending area;
  the divided third signal lines are connected to each other by the divided third signal line auxiliary pattern; and
  the divided third signal line auxiliary pattern are connected to each other by the divided third signal lines.

13. The electroluminescent display device of claim 7, wherein:
  each of the first signal line link pattern and the first signal line auxiliary link pattern are divided into a plurality in the bending area;
  the divided first signal line link patterns are connected to each other by the divided first signal line auxiliary link patterns; and
  the divided first signal line auxiliary link patterns are connected to each other by the divided first signal line link patterns.

14. The electroluminescent display device of claim 7, wherein the second organic insulation layer is formed at a time of forming the first organic insulation film.

15. An electroluminescent display device, comprising:
  a substrate comprising:
    an active area;
    first and second touch electrodes on an encapsulation layer in the active area, a part of at least one of the first and second touch electrodes being on a side surface of the encapsulation layer, another part of the at least one of the first and second touch electrodes being on a top surface of the encapsulation layer, the first and second touch electrodes overlapping each other on at least the side surface of the encapsulation layer;
    a routing wire connected to the at least one of the first and second touch electrodes; and
    a bezel area outside the active area and comprising a bending area;
  a first organic insulation layer in the active area, the first organic insulation layer being on part of a first signal line, the first signal line being in both the active area and the bezel area;
  a second organic insulation layer on the substrate in the bending area; and
  a third organic insulation layer on top and at least part of side surfaces of the second organic insulation layer.

16. The electroluminescent display device of claim 15, further comprising a first metal layer between the second and third organic insulation layers in the bending area, the first metal layer being connected to the routing wire.

17. The electroluminescent display device of claim 16, further comprising a fourth organic insulation layer on the routing wire.

18. The electroluminescent display device of claim 16, further comprising a fourth organic insulation layer on the routing wire, the fourth organic insulation layer extending over the encapsulation layer in the active area and the second organic insulation layer in the bending area.

19. The electroluminescent display device of claim 16, wherein the first metal layer is on top and side surfaces of the second organic insulation layer.

20. The electroluminescent display device of claim 16, wherein:
  the third organic insulation layer comprises portions separated from each other with the routing wire disposed therebetween; and
  the routing wire is electrically connected to the first metal layer in between the separated portions of the third organic insulating layer.

21. The electroluminescent display device of claim 16, further comprising a second metal layer under the first metal layer.

* * * * *